US007030406B2

(12) United States Patent
Edamura et al.

(10) Patent No.: US 7,030,406 B2
(45) Date of Patent: Apr. 18, 2006

(54) SEMICONDUCTOR PHOTOCATHODE AND PHOTOELECTRIC TUBE USING THE SAME

(75) Inventors: Tadataka Edamura, Hamamatsu (JP); Minoru Niigaki, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 146 days.

(21) Appl. No.: 10/701,533

(22) Filed: Nov. 6, 2003

(65) Prior Publication Data

US 2004/0089860 A1 May 13, 2004

(30) Foreign Application Priority Data

Nov. 6, 2002 (JP) .......................... P2002-322785

(51) Int. Cl.
*H01L 29/06* (2006.01)
*H01L 29/12* (2006.01)

(52) U.S. Cl. .............................. 257/10; 257/11; 257/9

(58) Field of Classification Search ................. 257/11, 257/9
See application file for complete search history.

(56) References Cited

U.S. PATENT DOCUMENTS

| | | | | |
|---|---|---|---|---|
| 3,814,993 | A | 6/1974 | Kennedy | 357/30 |
| 3,958,143 | A | 5/1976 | Bell | 313/94 |
| 5,065,205 | A * | 11/1991 | Biefeld et al. | 257/18 |
| 5,121,181 | A * | 6/1992 | Smith et al. | 257/21 |
| 5,404,026 | A * | 4/1995 | Mariella et al. | 257/10 |
| 5,650,635 | A * | 7/1997 | Razeghi et al. | 257/21 |

FOREIGN PATENT DOCUMENTS

JP 11-297171 10/1999

OTHER PUBLICATIONS

Infared Technology and Applications XXVI, Bjorn F. Andresen, Gabor F. Fulop, Marija Strojnik, Editors, Proceedings of SPIE vol. 4130 (2000).*

* cited by examiner

*Primary Examiner*—Nathan J. Flynn
*Assistant Examiner*—Victor A. Mandala, Jr.
(74) *Attorney, Agent, or Firm*—Drinker Biddle & Reath LLP

(57) ABSTRACT

A semiconductor photocathode comprises a $p^+$-type semiconductor substrate of GaSb, and a $p^-$-type light absorbing layer of InAsSb. A $p^+$-type hole blocking layer is formed between the substrate and the light absorbing layer having wider energy band gap than that of the light absorbing layer, the blocking layer being made of AlGaSb.

12 Claims, 8 Drawing Sheets

SEMICONDUCTOR PHOTOCATHODE AND PHOTOELECTRIC TUBE USING THE SAME

BACKGROUND OF THE INVENTION

1. Field of the Invention

This invention relates to a semiconductor photocathode emitting photoelectrons in response the incidence of photons and a photoelectric tube using the same.

2. Related Background Art

In general, the detectable longer wavelength limit of a semiconductor photocathode is largely determined by the semiconductor energy band gap of the light absorbing layer. For example, the upper detectable limit of wavelength is about 1.7 μm in a crystal system that lattice matches to an InP substrate.

On the other hand, a conventional photocathode is known that has a step-graded buffer layer on an InP substrate, wherein As to P composition ratio is gradually changed in the buffer layer (Japanese patent application laid-open No. 11-297191).

In this photocathode, light within the infrared region extending to a wavelength of about 2.3 μm is detectable, because the lattice mismatch between the InP substrate and the InGaAs light absorbing layer is reduced, the InGaAs light absorbing layer having In composition of 0.53 or more that is inherently lattice mismatched with the InP substrate.

A photocathode is also known (U.S. Pat. No. 3,958,143) where GaAs or GaSb is used as the substrate and various material systems, are used as the light absorbing layer. In this photocathode, when, for example, GaSb is used as the substrate and GaInAsSb having lattice constant closer to that of the substrate is used as the light absorbing layer, light having 1.77 μm wavelengh that is within the infrared region can be detected.

SUMMARY OF THE INVENTION

However, light having longer wavelength within the infrared region cannot be detected because the photocathode described in the above publication can detect light having shorter infrared wavelengths.

Currently, detectable light within an infrared region must have a wavelength of, at most, about 2.3 μm, and photoelectron emission in response to longer wavelengths has not been realized yet.

Therefore, it is necessary to use a semiconductor material as the light absorbing layer in order to detect longer wavelength light within an infrared region. Further, it would be advantageous if the semiconductor material were able to be grown epitaxially, be direct transition type, have large absorption coefficient, and have a smaller energy band gap.

In the III–V compound semiconductor, InAs–InSb has one of the smallest energy band gap systems. When GaSb is used as a substrate crystal, if the light absorbing layer consists of $InAs_{(1-x)}Sb_x$(x=0.09) that lattice matches with GaSb, this device can detect light at most about 4.3 μm wavelength within an infrared region.

However, as shown in FIG. 8, the combination of GaSb/InAsSb has an anomalous energy band structure where bottom of the conduction band of InAsSb is positioned about 0.1 eV lower than the top of the valence band of GaSb. Therefore, the valence band of GaSb and the conduction band of InAsSb are connected to cause a situation in which both of electrons and holes exist.

Therefore, if the electrons are generated in the light absorbing layer, there will be a problem because electrons cannot exit the photocathode.

The purpose of the present invention is to provide a semiconductor photocathode having good sensitivity within an infrared region and a photoelectric tube using the same.

In order to achieve the above purpose, the invention provides a semiconductor photocathode emitting electrons in response to the incidence of infrared radiation, the semiconductor photocathode comprising a semiconductor substrate made of GaSb; a light absorbing layer made of $InAs_{(1-x)}Sb_x$($0<x<1$); a first compound semiconductor layer having wider energy band gap than that of said light absorbing layer and including Al.

The first compound semiconductor layer is formed between the semiconductor substrate and the light absorbing layer.

In the semiconductor photocathode of the present invention, $InAs_{(1-x)}Sb_x$, is defined as the light absorbing layer, and has its lattice matched with the semiconductor substrate made of GaSb. This photocathode has a structure such that the first compound semiconductor layer is formed between the semiconductor substrate and the light absorbing layer and the first compound semiconductor layer has wider energy band gap than that of said light absorbing layer and includes Al.

That is, in order to prevent recombination of electrons and holes which is caused by the connection of the valence band of GaSb and the valence band of InAsSb in GaSb substrate and InAsSb light absorbing layer, the first compound semiconductor layer (hole blocking layer having a wide band gap) is inserted between the substrate and the light absorbing layer, so that the valence band of the GaSb substrate and the conduction band of the InAsSb light absorbing layer are separated to each other. As the result, the hole blocking layer (the first compound semiconductor layer) prevents electrons generated in the light absorbing layer from recombining holes from the substrate so that they annihilate. Therefore, the cut-off wavelength within the sensitive wavelength is increased.

Preferably, the photocathode further comprises a second compound semiconductor layer provided so as to sandwich the light absorbing layer together with the first compound semiconductor layer.

As a result of this structure, it also becomes possible to block the flow of holes from the contact layer to the light absorbing layer, the contact layer being formed on the opposite side of the semiconductor substrate from the light absorbing layer, therefore, the electrons exit the photocathode efficiently.

Both the first and second compound semiconductor layers are preferably made of $Al_yGa_{(1-y)}Sb$($0<y<1$) This structure can form the compound semiconductor layer that satisfies lattice matching with the semiconductor substrate made of GaSb and has a wider energy band gap than the light absorbing layer.

Further, both the first and second compound semiconductor layers may be made of $Al_yGa_{(1-y)}As_zSb_{(1-z)}$ ($0<y<1$, $0<z<1$). As this result, it can exactly lattice match with the semiconductor substrate made of GaSb. For example, when the Al composition "y" is set to 0.4, it can thoroughly lattice match with the GaSb semiconductor substrate if the As composition "z" is set to 0.03.

Both the first and second compound semiconductor layers may comprise a superlattice layer formed by a stack of alternate layers of AlSb and GaSb. In this structure, the Al composition ratio can freely be set by changing the thickness of the AlSb layer and the thickness of the GaSb layer in the stack cycle.

Further, when the AlSb/GaSb superlattice structure is used as the first compound semiconductor layer that is positioned between the semiconductor substrate and the light absorbing layer, it can function as a superlattice buffer layer between the semiconductor substrate and the light absorbing layer. As a result, the crystal defect can be reduced, and improved characteristics such as increased sensitivity and reduced a dark current realized.

Further, the photoelectric tube of the present invention comprises the semiconductor photocathode and an anode related to the semiconductor photocathode, wherein the semiconductor photocathode and the anode are enclosed in a vacuum vessel.

The photoelectric tube of the present invention of the photoelectric tube is, for example, a photomultiplier tube. In this case, the photoelectrons generated in response to the incidence of light on the above semiconductor photocathode are multiplied, and the multiplied electrons reach the anode.

When comprising the above semiconductor photocathode, the photomultiplier tube can detect a long wavelength side cut-off wavelength in a sensitive wavelength within an infrared region, with high sensitivity.

DESCRIPTION OF THE PREFERRED EMBODIMENTS

Figure 1:
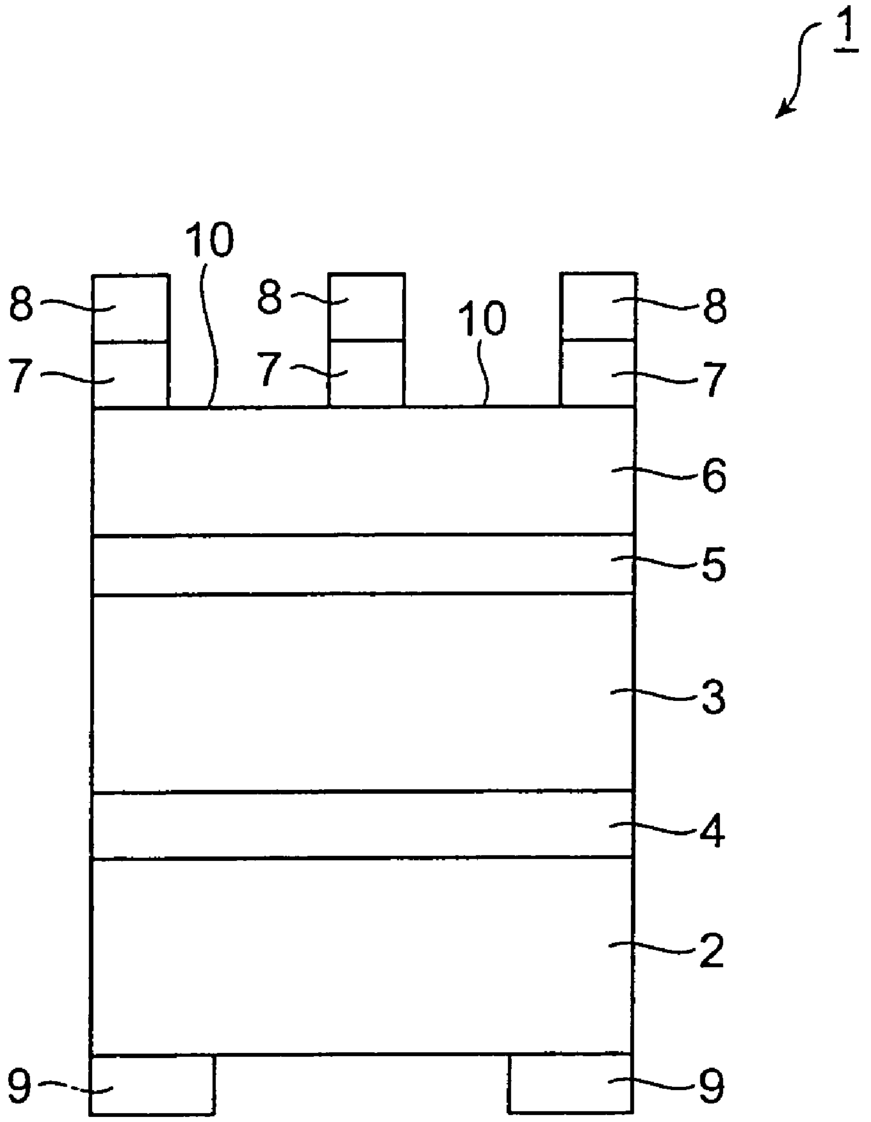
FIG. 1 is a diagram showing a semiconductor photocathode according to the first embodiment.

The preferred embodiments of the present invention will be explained below on the basis of the drawings. Note that the same elements will be given the same reference numerals, and repetitive explanation will be omitted.

FIG. 1 is a diagram showing a semiconductor photocathode according to the first embodiment.

The semiconductor photocathode 1 shown in this figure comprises: a $p^+$-type semiconductor substrate 2 made of GaSb; and a $p^-$-type light absorbing layer 3 made of InAsSb.

A $p^+$-type hole blocking layer 4 that is formed between semiconductor substrate 2 and light absorbing layer 3 has a wider energy band gap than that of light absorbing layer 3 and is made of AlGaSb.

Further, a $p^-$-type hole blocking layer 5 of AlGaSb is formed on light absorbing layer 3, and a $p^-$-type electron emitting layer 6 of GaSb is formed on hole blocking layer 5. An $n^+$-type contact layer 7 of GaSb is formed on the electron emitting layer 6. This contact layer 7 and electron emitting layer 6 form a pn junction.

Each of the above mentioned layers are formed by sequential epitaxial growth by using a molecular beam epitaxial method or chemical vapor deposition. The thickness of each of the layers is as follows: each of the hole blocking layer 4,5 is set to about 0.2 μm, light absorbing layer 3 is set to about 1.0 μm, electron emitting layer 6 is set to about 0.5 μm, and contact layer 7 is set to about 0.2 μm, for example.

Further, the carrier concentration of the above layers is as follows: semiconductor substrate 2 is equal to or more than $5\times10^{17}cm^{-3}$, hole blocking layer 4 is equal to or more than $5\times10^{17}cm^{-3}$, light absorbing layer is equal to or less than $1\times10^{17}cm^{-3}$, hole blocking layer 5 is equal to or less than $1\times10^{17}cm^{-3}$, electron emitting layer 6 is equal to or less than $1\times10^{17}cm^{-3}$, and contact layer 7 is equal to or more than $1\times10^{18}cm^{-3}$.

A first electrode 8 is formed on and is in Ohmic contact with the contact layer 7. The first electrode 8 is made of a metal alloy, for example, including Au, Ge and/or Ni.

First electrode 8 and contact layer 7 are patterned in a form of a lattice or grid pattern by using a photolithography technology and an etching technology The exposed surface of electron emitting layer 6 is coated with a Cs layer 10. Therefore, the work function of the surface is decreased to easily emit photoelectrons to a vacuum.

On the other hand, a second electrode 9 is also formed on and is in Ohmic contact with the lower surface of semiconductor substrate 2. The second electrode 9 is made of a metal alloy, for example, including Cr and/or Au.

In the above mentioned semiconductor photocathode 1, when the Sb composition ratio "x" of light absorbing layer 3 is 0.09, it lattice matches with the semiconductor substrate 2. The light absorbing layer 3 is made of $InAs_{(1-x)}Sb_x$, where, $0<x<1$. Each of the first and second compound semiconductor layers 4, 5 is made of $Al_yGa_{(1-y)}Sb$, where, $0<y<1$.

The applicants found that it is possible to take electrons generated in the light absorbing layer 3 to outside when the Al composition ratio "y" of hole blocking layers 4, 5 is set to equal to or more than 0.19 to less than 1.0 ($0.19<y<1.0$).

Figure 2:
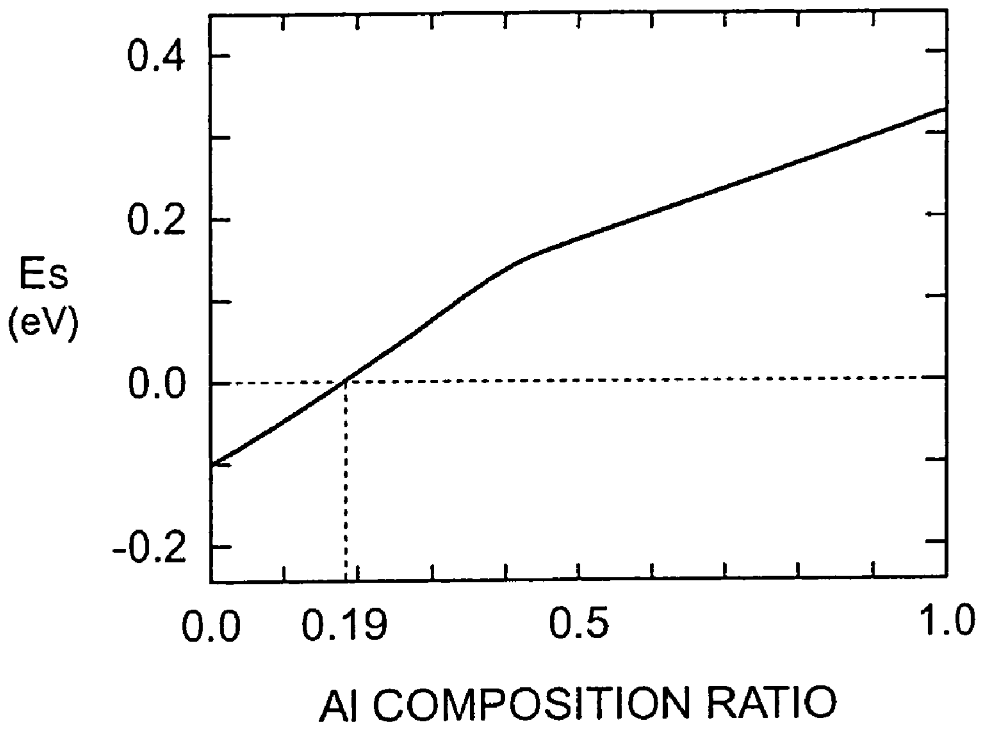
FIG. 2 is a diagram showing a relationship between the Al composition ratio in the hole blocking layer and the energy difference, the difference being between the lower end position of the conduction band of the light absorbing layer and the upper end position of the valence band in the hole blocking layer.
Figure 3B:
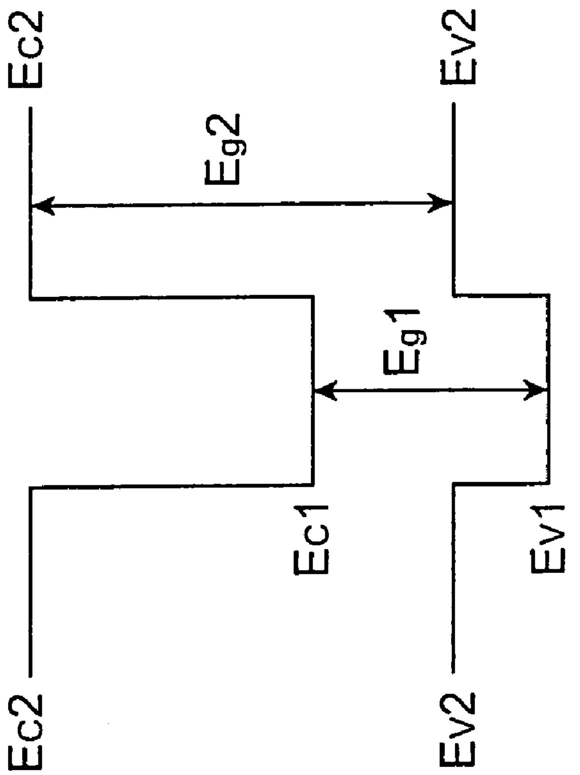
FIG. 3B is a schematic diagram showing the energy band gap between the light absorbing layer and hole blocking layer.
Figure 3A:
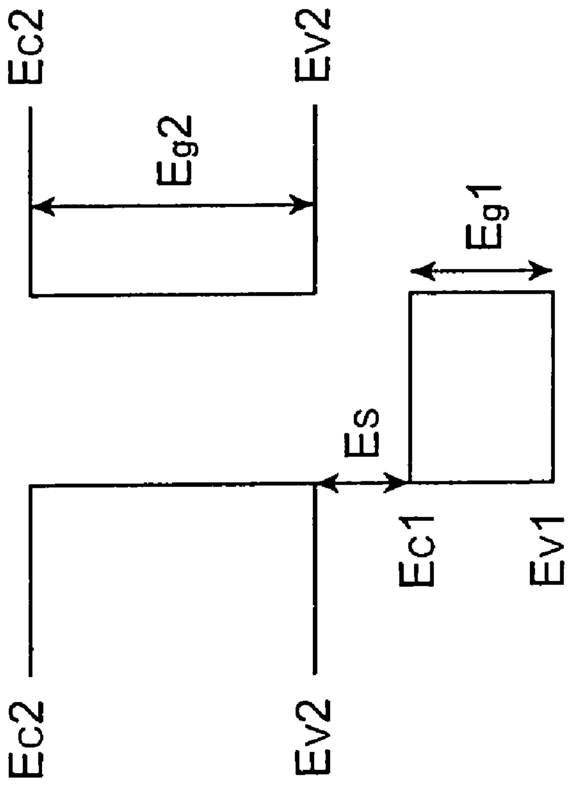
FIG. 3A is a schematic diagram showing the energy band gap between the light absorbing layer and hole blocking layer.

FIG. 2 is a diagram showing a relationship between the Al composition ratio in the hole blocking layer and the energy difference Es, the difference Es being defined between the bottom of the conduction band of light absorbing layer 3 and the top of the valence band in hole blocking layers 4, 5. FIGS. 3A and 3B are schematic diagrams each showing an energy band gap between light absorbing layer 3 and hole blocking layers 4, 5.

As shown in FIG. 2, when the Al composition ratio in hole blocking layer 4,5 is less than 0.19, Es (=Ec1−Ev2) becomes negative. The energy band gaps of hole blocking layers 4,5 and light absorbing layer 3 at this time is shown in FIG. 3A. The lower end position Ec1 of the conduction band in light absorbing layer 3 is positioned under the upper end positions Ev2 of valence bands in hole blocking layers 4,5. Therefore, even when electrons are generated in light absorbing layer 3, since the electrons and holes are recombined together, it is difficult for electrons exit. So, this photocathode does not work effectively.

On the other hand, when each Al composition ratio in hole blocking layers 4,5 is equal to or more than 0.19, Es becomes positive (see FIG. 2). The energy band gaps of hole blocking layer 4, 5 and light absorbing layer 3 at this time is shown in FIG. 3B. Lower end position Ec1 of conduction band in light absorbing layer 3 is positioned above Ev2 of hole blocking layers 4, 5.

As stated above, since the conduction band of light absorbing layer 3 and the valence bands of hole blocking layers 4, 5 are separated, electrons and holes are not recombined so that the electrons and the holes do not annihilate. Therefore, the electrons can be emitted and as the result, this photocathode can work effectively.

Figure 4:
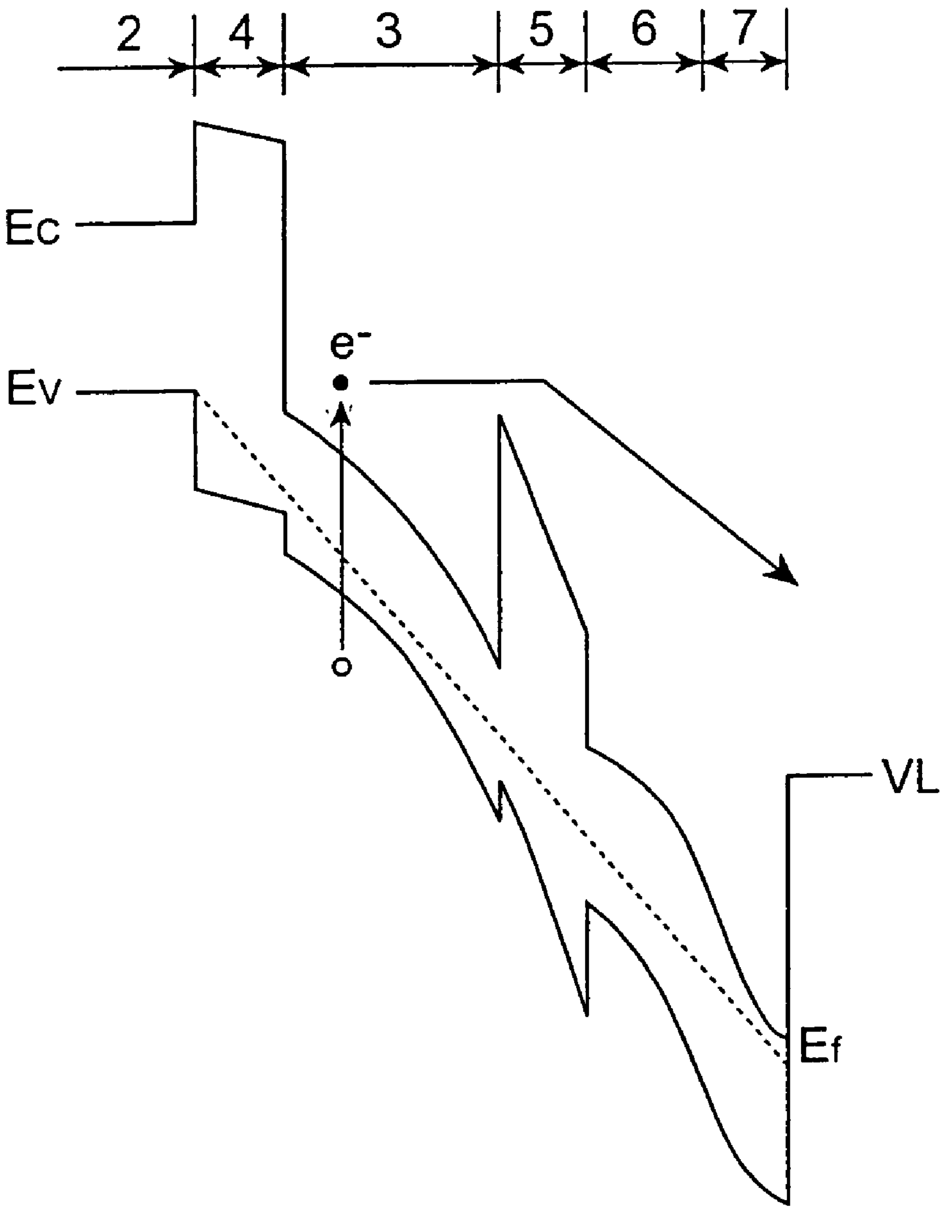
FIG. 4 is the energy band diagram of the semiconductor photocathode 1 shown in FIG. 1 at the time when a bias is applied thereto.

FIG. 4 is an energy band diagram of the semiconductor photocathode 1 shown in FIG. 1 at the time when a bias is applied thereto. In this figure, the energy level of the upper end position of valence band is indicated by Ev, the energy level of lower position of conduction band is indicated by Ec, the Fermi level is indicated by Ef, the vacuum level is indicated by VL.

Photoelectrons generated in the light absorbing layer 3 in response to incident light having an infrared wavelength can move toward electron emitting layer 6 without interference by hole blocking layer 5 when the bias is applied. Therefore, the photoelectrons effectively radiate into vacuum.

As stated above, semiconductor photocathode 1 according to the present embodiment suppresses the recombination between the electrons and holes, that occurs when using semiconductor substrate 2 made of GaSb and light absorbing layer 3 made of InAsSb, therefore, the photocathode detects light within infrared region having maximum wavelength of 4.3 μm.

Note that each of the hole blocking layers 4,5 may be made of $Al_yGa_{(1-y)}As_zSb_{(1-z)}$ ($0<y<1$, $0<z<1$). As a result, it can completely lattice match with the semiconductor substrate 2 made of GaSb. Therefore, the generation of threading dislocation caused by lattice mismatch between this layer and the substrate crystal is suppressed and a crystal defect that functions as a carrier trapping center can be decreased. As a result, the sensitivity is increased and dark currents are reduced.

Further, both hole blocking layers 4, 5 may be made of a mixed crystal layer or formed by a superlattice layer made of a stack of alternate layers of AlSb and GaSb. In these structure, the Al composition ratio can freely be set by changing the thickness of the AlSb layer and the thickness of the GaSb layer in the stack cycle. For example, when the Al composition ratio is set to 50%, if one stack cycle is defined by a 5 nm AlSb layer stacked together with a 5 nm GaSb layer, the hole blocking layer having 10 to 20 stack cycles will function effectively.

Figure 5:
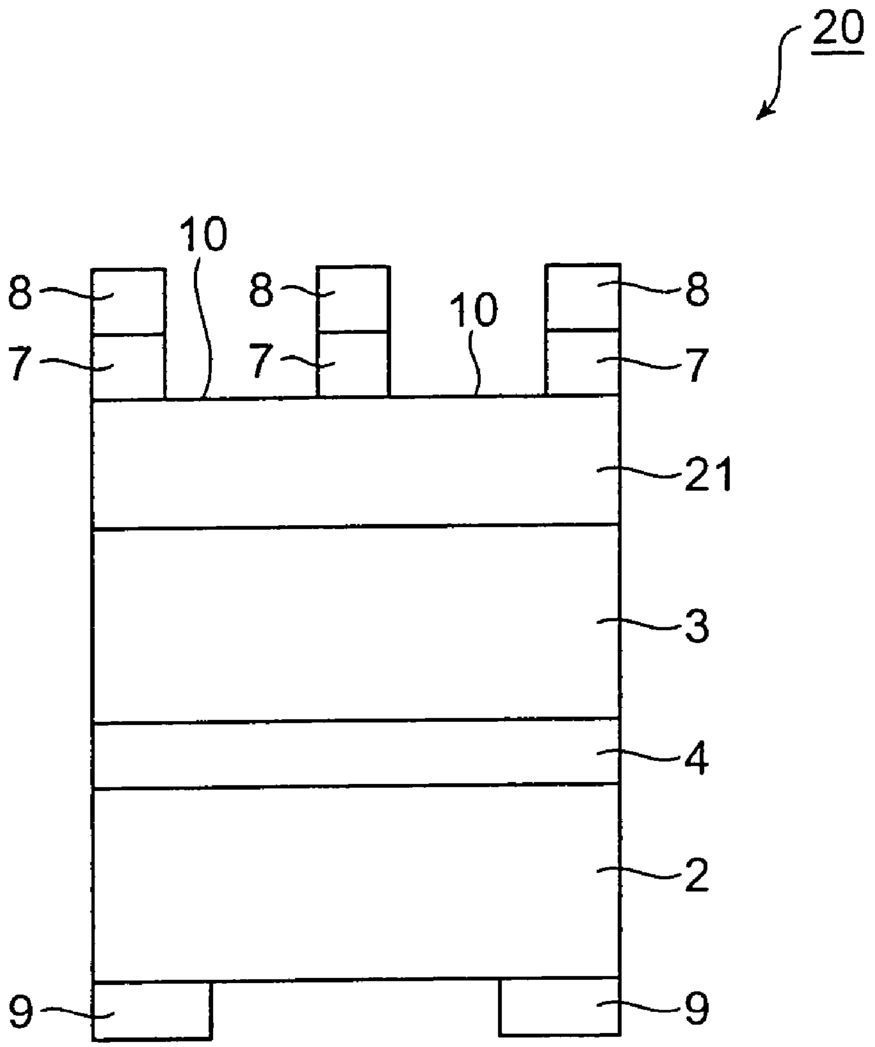
FIG. 5 is a diagram showing a semiconductor photocathode according to the second embodiment.

FIG. 5 is a diagram showing a semiconductor photocathode according to the second embodiment. As shown in this figure, the semiconductor photocathode 20 has a $p^-$-type AlGaSb layer 21 instead of hole blocking layer 5 and electron emitting layer 6 in semiconductor photocathode 1 of the first embodiment, the $p^-$-type AlGaSb layer 21 having both of the functions of the hole blocking layer 5 and electron emitting layer 6.

In this case, a pn junction is formed between AlGaSb layer 21 and contact layer 7. AlGaSb layer 21 has, for example, a thickness of about 0.5 μm and carrier concentration of equal to or less than $1.0\times10^{17}cm^{-3}$.

Figure 6:
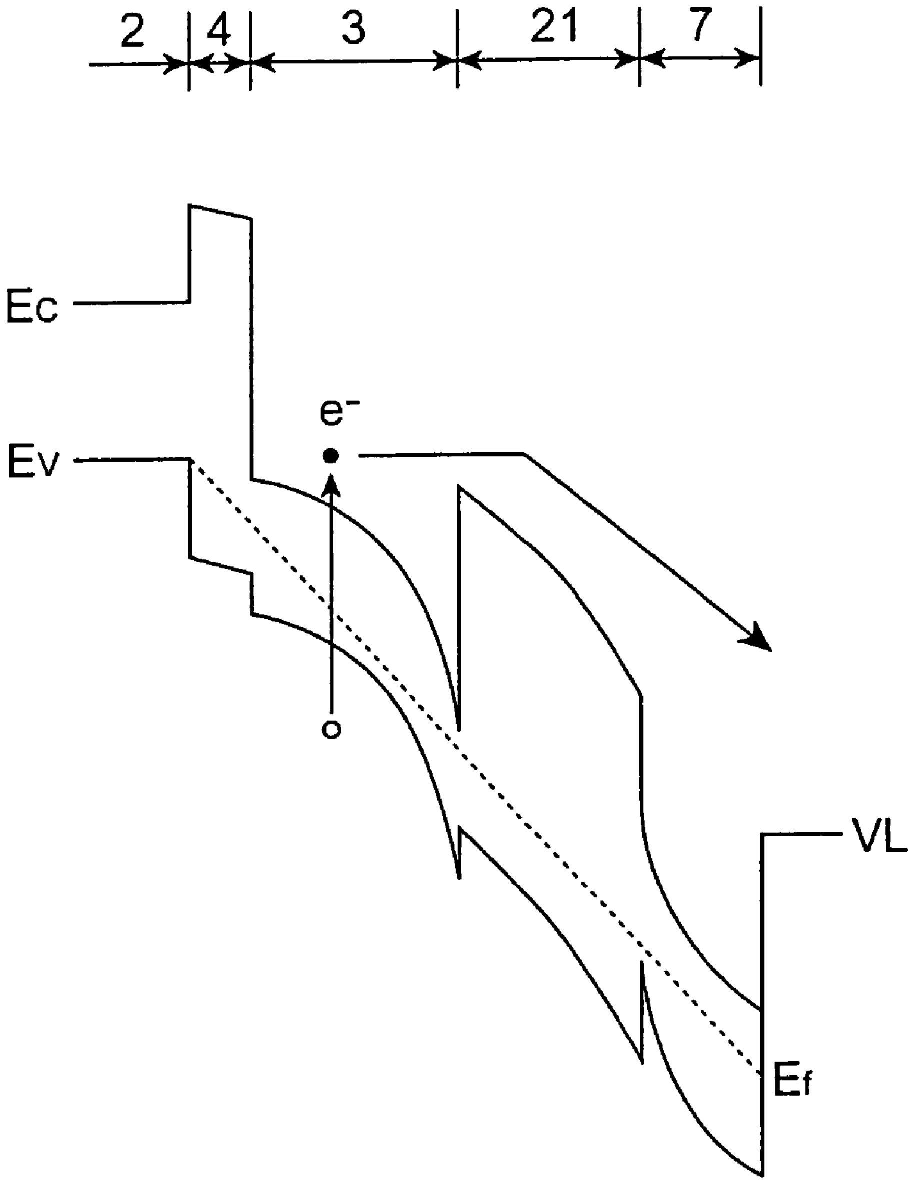
FIG. 6 is an energy band diagram of the semiconductor photocathode 20 shown in FIG. 5 at the time when a bias is applied thereto.

FIG. 6 is an energy band diagram of semiconductor photocathode 20 shown in FIG. 5 at the time when a bias is applied thereto.

In this case, as is similar to the first embodiment, photoelectrons generated in light absorbing layer 3 in response to incident light having an infrared wavelength can move toward electron emitting layer 6 without interference by AlGaSb layer 21 when the bias is applied.

Next, a photomultiplier tube having one of the above mentioned semiconductor photocathodes will be explained.

Figure 7:
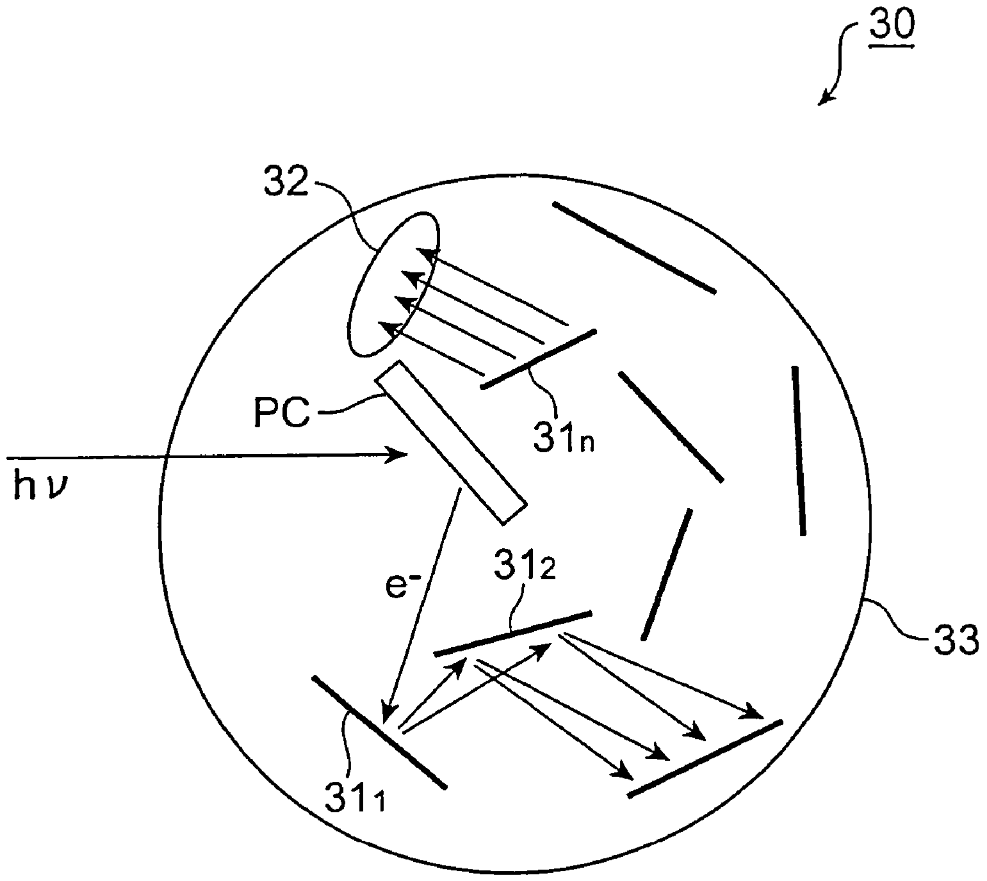
FIG. 7 is a cross-sectional schematic view of the photomultiplier tube comprising the semiconductor photocathode shown in FIG. 1 or FIG. 5.
Figure 8:
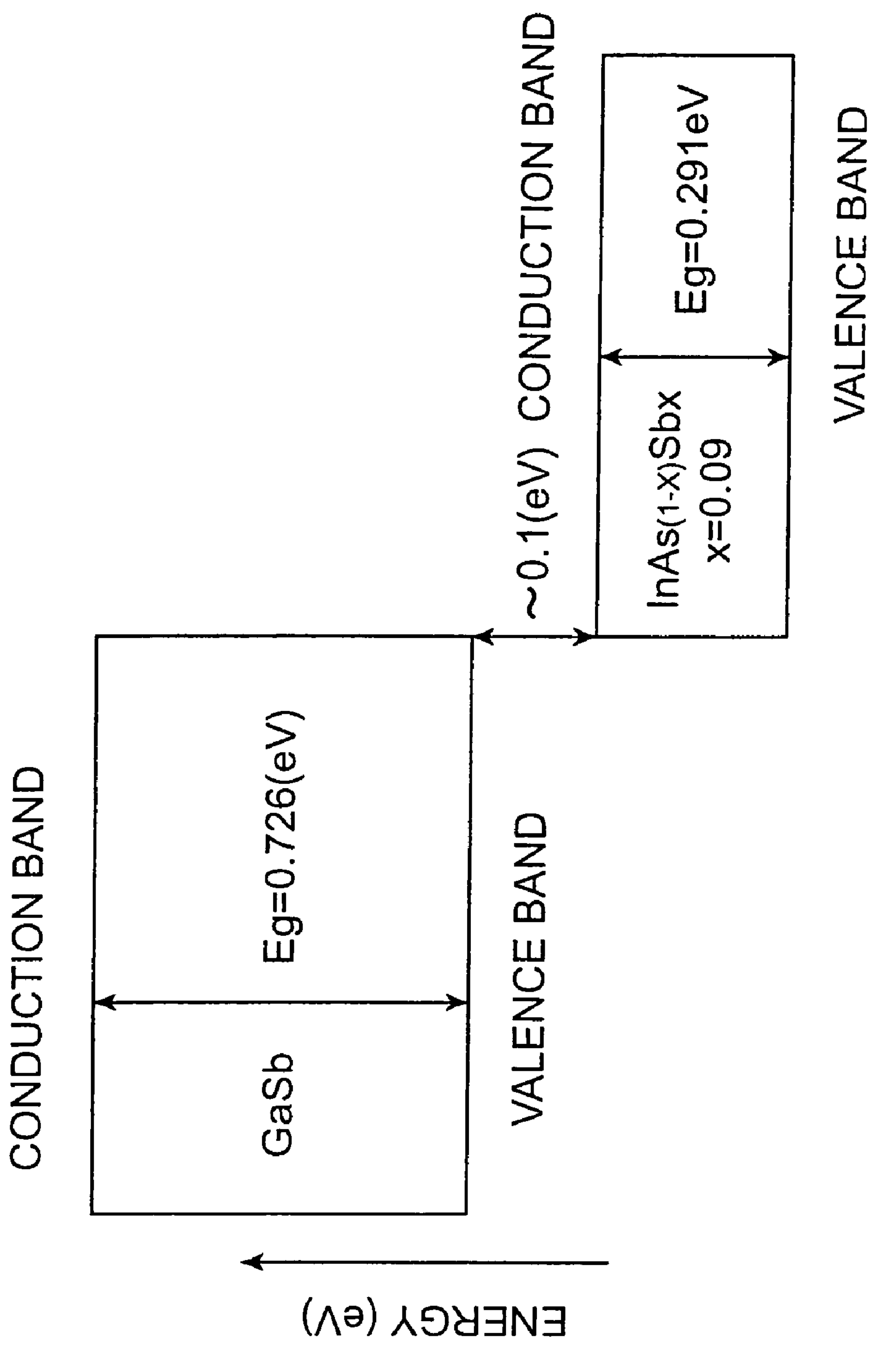
FIG. 8 is a schematic diagram showing the energy band gaps of the GaSb substrate and InAsSb layer.

FIG. 7 is a cross-sectional schematic view of the photomultiplier tube comprising one of the above mentioned semiconductor photocathodes.

The photomultiplier tube 30 comprises: a semiconductor photocathode PC; a focusing electrode not depicted; secondary electron multiplier consisting of first stage dynode $\mathbf{31}_1$, second stage dynode $\mathbf{31}_2$, . . . , and the n-th stage dynode $\mathbf{31}_n$; an anode 32 for collecting electrons secondarily multiplied; and a vacuum vessel 33 for accommodating these elements.

Here, the semiconductor photocathode PC indicates one of the semiconductor photocathodes 1 and 20 described in the above embodiments.

Most of the incident light hv within the infrared region is absorbed in light absorbing layer 3 of semiconductor photocathode PC, the excited photoelectrons e are accelerated by the internal electric field, and after that, are emitted from the surface of Cs layer 10 to the interior of vacuum vessel 33.

The paths of photoelectrons $e^-$ emitted inside vacuum vessel 33 are corrected by the focusing electrode, and the photoelectrons $e^-$ are efficiently incident on the first stage dynode $\mathbf{31}_1$. The first stage dynode $\mathbf{31}_1$ emits secondary electrons toward the second stage dynode $\mathbf{31}_2$ in response to the incidence of the photoelectrons $e^-$. The number of the secondary electrons is larger than the number of the primary electrons that were incident on the first stage dynode $\mathbf{31}_1$.

The second stage dynode $\mathbf{31}_2$ multiplies secondary electrons that are incident thereon in the same manner as the first stage dynode $\mathbf{31}_1$, and emits them to the next stage dynode. This multiplication is repeated by each dynode until the electrons are reached to the n-th stage dynode dynode $\mathbf{31}_n$.

The number of photoelectrons that ultimately reach anode 32 is approximately one million times the number initially incident on first stage dynode 311, and are converted to an electric detection signal sent outside of vacuum vessel 33.

When the photomultiplier tube comprising the semiconductor photocathode PC of the above embodiment, can detect infrared radiation having a wavelength equal to or greater than about 2 μm with high sensitivity.

Although the present invention was concretely explained on the basis of the embodiments. The present invention is not limited to the embodiments.

For example, in the above embodiments, a so-called reflection type semiconductor photocathode was explained. In this type of photocathode, a light incident surface and a photoelectron emitting surface are positioned at the same side of the photocathode. The above photocathode may be applicable to a so-called transmission type photocathode. In this type of photocathode, a light incident surface and a photoelectron emitting surface are positioned at the opposite side of the photocathode.

According to the present invention, in the photocathode comprising the semiconductor substrate made of GaSb and the light absorbing layer made of InAsSb, and the photocathode further comprises a compound semiconductor layer including Al, having wider energy band gap than that of the light absorbing layer, and the semiconductor photocathode can detect infrared radiation having wavelength equal to or greater than about 2 μm with high sensitivity.

What is claimed is:

1. A semiconductor photocathode emitting electrons from a front surface in response to an incidence of infrared radiation, comprising:
   a semiconductor substrate made of GaSb;
   a light absorbing layer made of $InAs_{(1-x)}Sb_x$, where, 0<x<1;
   a first compound semiconductor layer having wider energy band gap than that of said light absorbing layer, said first compound semiconductor layer including Al,
   wherein said first compound semiconductor layer is formed between said semiconductor substrate and said light absorbing layer;
   first and second electrodes respectively formed on front and back surfaces of said semiconductor photocathode; and
   an n-type contact layer interposed between said first electrode and said front surface,
   wherein said semiconductor substrate is p-type, and
   wherein said first compound semiconductor layer is p-type.

2. The semiconductor photocathode according to claim 1, wherein one side of said semiconductor substrate is exposed.

3. The semiconductor photocathode according to claim 1, further comprises a second compound semiconductor layer provided so as to sandwich said light absorbing layer together with said first compound semiconductor layer.

4. A photoelectric tube comprising
   the semiconductor photocathode according to claim 3; and
   an anode related to said semiconductor photocathode, wherein said semiconductor photocathode and said anode are enclosed in a vacuum vessel.

5. A semiconductor photocathode emitting electrons in response to an incidence of infrared radiation, comprising:
   a semiconductor substrate made of GaSb;
   a light absorbing layer made of $InAs_{(1-x)}Sb_x$, where, 0<x<1;
   a first compound semiconductor layer having wider energy band gap than that of said light absorbing layer, said first compound semiconductor layer including Al, wherein said first compound semiconductor layer is formed between said semiconductor substrate and said light absorbing layer; and
   a second compound semiconductor layer provided so as to sandwich said light absorbing layer together with said first compound semiconductor layer,
   wherein both said first and second compound semiconductor layers are made of $Al_yGa_{(1-y)}Sb$, where, 0<x<1.

6. The semiconductor photocathode according to claim 5, wherein y is set to be in a range equal to or greater than 0.19 to less than 1.0.

7. A photoelectric tube comprising
   the semiconductor photocathode according to claim 5; and
   an anode related to said semiconductor photocathode, wherein said semiconductor photocathode and said anode are enclosed in a vacuum vessel.

8. A semiconductor photocathode emitting electrons in response to an incidence of infrared radiation, comprising:
   a semiconductor substrate made of GaSb;
   a light absorbing layer made of $InAs_{(1-x)}Sb_x$, where, 0<x<1;
   a first compound semiconductor layer having wider energy band gap than that of said light absorbing layer, said first compound semiconductor layer including Al, wherein said first compound semiconductor layer is formed between said semiconductor substrate and said light absorbing layer; and
   a second compound semiconductor layer provided so as to sandwich said light absorbing layer together with said first compound semiconductor layer,
   wherein both said first and second compound semiconductor layers are made of $Al_yGa_{(1-y)}As_zSb_{(1-z)}$, where, 0<y<1, and 0<z<1.

9. The semiconductor photocathode according to claim 8, wherein y is set to be in a range equal to or greater than 0.19 to less than 1.0.

10. A photoelectric tube comprising
   the semiconductor photocathode according to claim 8; and
   an anode related to said semiconductor photocathode, wherein said semiconductor photocathode and said anode are enclosed in a vacuum vessel.

11. A semiconductor photocathode emitting electrons in response to an incidence of infrared radiation, comprising:
   a semiconductor substrate made of GaSb;
   a light absorbing layer made of $InAs_{(1-x)}Sb_x$, where, 0<x<1;
   a first compound semiconductor layer having wider energy band gap than that of said light absorbing layer, said first compound semiconductor layer including Al, wherein said first compound semiconductor layer is formed between said semiconductor substrate and said light absorbing layer; and
   a second compound semiconductor layer provided so as to sandwich said light absorbing layer together with said first compound semiconductor layer,
   wherein both the first and second compound semiconductor layer comprise a superlattice layer formed by a stack of alternate layers of AlSb and GaSb.

12. A photoelectric tube comprising
   the semiconductor photocathode according to claim 11; and
   an anode related to said semiconductor photocathode, wherein said semiconductor photocathode and said anode are enclosed in a vacuum vessel.

* * * * *